United States Patent
Ouyang et al.

(10) Patent No.: US 11,908,701 B2
(45) Date of Patent: Feb. 20, 2024

(54) PATTERNING METHOD AND MANUFACTURING METHOD OF SEMICONDUCTOR DEVICE

(71) Applicant: Taiwan Semiconductor Manufacturing Company, Ltd., Hsinchu (TW)

(72) Inventors: Christine Y Ouyang, Hsinchu (TW); Li-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 187 days.

(21) Appl. No.: 17/238,170

(22) Filed: Apr. 22, 2021

(65) Prior Publication Data

US 2022/0344168 A1    Oct. 27, 2022

(51) Int. Cl.
*H01L 21/311* (2006.01)
*H01L 21/02* (2006.01)
*H01L 21/768* (2006.01)

(52) U.S. Cl.
CPC .. *H01L 21/31116* (2013.01); *H01L 21/02118* (2013.01); *H01L 21/31144* (2013.01); *H01L 21/76805* (2013.01); *H01L 21/76895* (2013.01)

(58) Field of Classification Search
CPC ......... H01L 21/02118; H01L 21/31144; H01L 21/76805; H01L 21/76895
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2018/0082942 A1* | 3/2018 | Chawla ............. H01L 21/76814 |
| 2021/0301392 A1* | 9/2021 | Illiberi ................ C23C 18/1212 |

* cited by examiner

*Primary Examiner* — Matthew L Reames
*Assistant Examiner* — Fakeha Sehar
(74) *Attorney, Agent, or Firm* — JCIPRNET

(57) ABSTRACT

A patterning method includes at least the following steps. A first material layer is provided. A second material layer is provided over the first material layer. The second material layer partially exposes the first material layer. A passivation layer is formed over the first material layer and the second material layer. A growth rate of the passivation layer on the second material layer is greater than a growth rate of the passivation layer on the first material layer. A first etching process is performed to remove a portion of the passivation layer and a portion of the first material layer.

20 Claims, 17 Drawing Sheets

PATTERNING METHOD AND MANUFACTURING METHOD OF SEMICONDUCTOR DEVICE

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
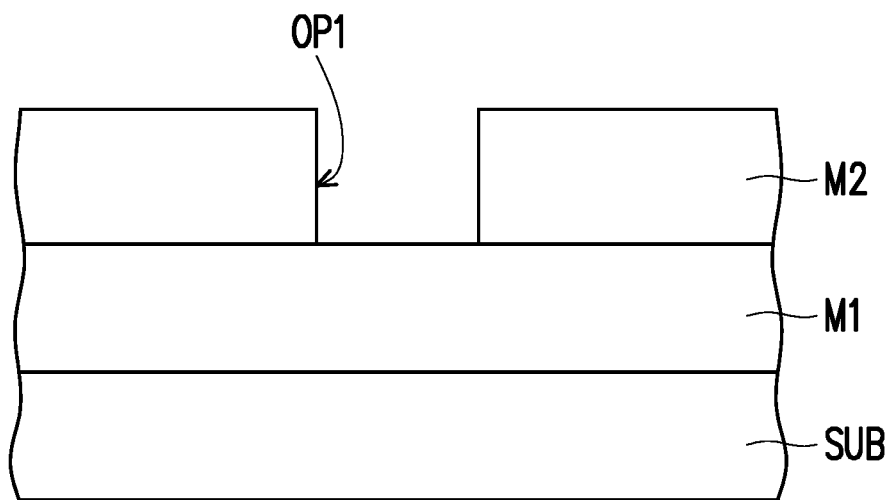
FIG. 1A to FIG. 1D are schematic cross-sectional views illustrating a patterning method in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 1D are schematic cross-sectional views illustrating a patterning method in accordance with some embodiments of the disclosure. Referring to FIG. 1A, a first material layer M1 and a second material layer M2 are provided on a substrate SUB. In some embodiments, the substrate SUB may be made of any material that is able to support the first material layer M1 and the second material layer M2 thereon. For example, the substrate SUB may be made of a dielectric material, a semiconductor material, or a conductive material. In some embodiments, the second material layer M2 is over the first material layer M1. For example, the second material layer M2 is directly in contact with the first material layer M1. In some embodiments, the second material layer M2 partially exposes the first material layer M1. For example, the second material layer M2 has a first opening OP1 which exposes a portion of the first material layer M1.

In some embodiments, an etching selectivity between the first material layer M1 and the second material layer M2 is low (i.e. close to 1). For example, the etching selectivity between the first material layer M1 and the second material layer M2 ranges between 1:1 and 3:1. Herein, the etching selectivity is denoted by a ratio between an etch rate of the first material layer M1 and an etch rate of the second material layer M2. In some embodiments, both of the first material layer M1 and the second material layer M2 are made of dielectric material. Nevertheless, the first material layer M1 and the second material layer M2 are made of different dielectric materials. For example, the first material layer M1 contains oxide while the second material layer M2 contains nitride. However, the disclosure is not limited thereto. In some alternative embodiments, the first material layer M1 contains nitride while the second material layer M2 contains oxide. In some alternative embodiments, the first material layer M1 contains both oxide and nitride while the second material layer M2 contains one of the oxide and nitride, or vice versa. In some embodiments, examples of the dielectric material includes silicon oxide ($SiO_2$), silicon oxynitride (SiON), silicon nitride (SiN), carbonized silicon nitride (SiCN), silicon carbon oxynitride (SiCON), or the like. In some alternative embodiments, the dielectric material includes metal oxides or metal nitrides. Examples of the metal oxide include $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or the like. Examples of the metal nitride include TiN, TaN, WN, TiAlN, TaCN, or the like. In some embodiments, the dielectric material may include a silicate such as HfSiO, HfSiON, LaSiO, AlSiO, or the like. In some embodiments, the dielectric material includes a composite of metal oxide or nitride listed above. It is understood that the materials listed above are merely exemplary illustrations of the first material layer M1 and the second material layer M2. In some alternative embodiments, the first material layer M1 and the second material layer M2 may include other existing materials as long as the etching selectivity between the first material layer M1 and the second material layer M2 is low.

Figure 1B:
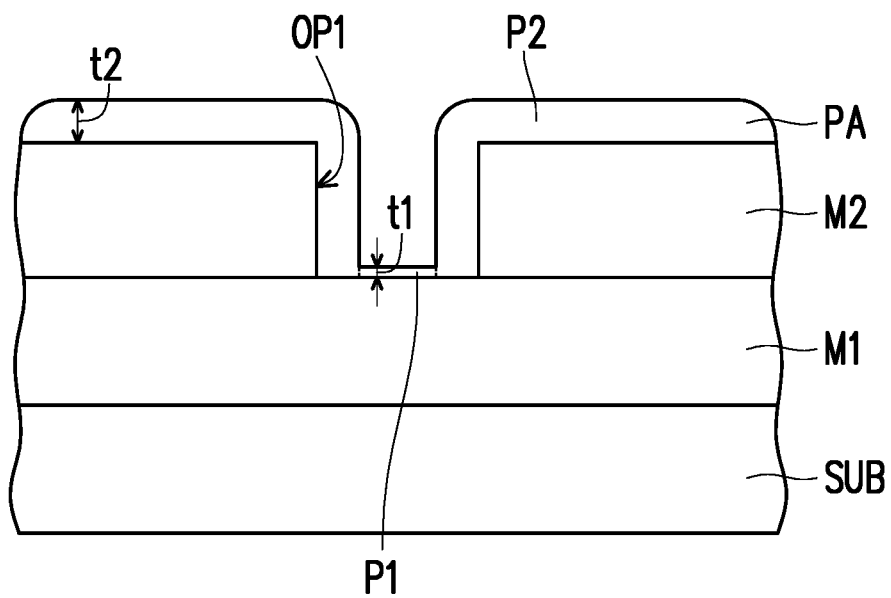

Referring to FIG. 1B, a passivation layer PA is formed over the first material layer M1 and the second material layer M2. In some embodiments, the passivation layer PA is formed over a top surface of the second material layer M2, sidewalls of the first opening OP1, and a bottom surface of the first opening OP1 (i.e. the exposed top surface of the first material layer M1). In some embodiments, the passivation layer PA includes an organometallic layer, a polymeric material layer, or a combination thereof. For example, the passivation layer PA may be a single organometallic layer, a single polymeric material layer, or a laminate of organometallic layer(s) and/or polymeric material layer(s). In some embodiments, the organometallic layer includes aluminum alkoxide, titanium alkoxide, the like, or a combination thereof. On the other hand, the polymeric material layer includes polyurea, polythiourea, polyurethane, the like, or a combination thereof.

In some embodiments, the passivation layer PA is formed by molecular layer deposition (MLD). For example, a precursor material is provided in the etching chamber. In some embodiments, the precursor material is provided in a gas form. In some alternative embodiments, the precursor material is provided in a liquid form. In some embodiments, the precursor material includes, but is not limited to, diisocyanate/diamine, diisothiocyanate/diamine, diisocyanate/diol, trimethylaluminum/ethylene glycol, titanium tetrachloride/ethylene glycol, titanium tetrachloride/glycerol, the like, or a combination thereof. In some embodiments, the precursor material is reacted with the first material layer M1 and the second material layer M2 to form the passivation layer PA. In some embodiments, the precursor material is deposited at a process temperature ranging from 25° C. to 200° C.

In some embodiments, since the first material layer M1 and the second material layer M2 are made of different materials, a growth rate of the passivation layer PA on the second material layer M2 is different from a growth rate of the passivation layer PA on the first material layer M1. For example, the growth rate of the passivation layer PA on the second material layer M2 is greater than the growth rate of the passivation layer PA on the first material layer M1. That is, the precursor material has a faster nucleation on the second material layer M2 than on the first material layer M1. As a result, the passivation layer PA formed on the second material layer M2 has a greater thickness than the passivation layer PA formed on the first material layer M1. For example, as illustrated in FIG. 1B, the passivation layer PA is divided into a first portion P1 and a second portion P2. The first portion P1 is formed on the first material layer M1 while the second portion P2 is formed on the second material layer M2. In some embodiments, the second portion P2 is formed on the top surface of the second material layer M2 and sidewalls of the first opening OP1. On the other hand, the first portion P1 is formed on the top surface of the first material layer M1 that is not being occupied by the second portion P2. In some embodiments, the first portion P1 of the passivation layer PA is conformally formed on the first material layer M1, and the second portion P2 of the passivation layer PA is conformally formed on the second material layer M2. For example, the first portion P1 of the passivation layer PA has a uniform thickness t1 and the second portion P2 of the passivation layer PA has a uniform thickness t2. As illustrated in FIG. 1B, the thickness t2 of the second portion P2 of the passivation layer PA is greater than the thickness t1 of the first portion P1 of the passivation layer PA. In some embodiments, the thickness t1 of the first portion P1 ranges from 0.01 nm to 2 nm, and the thickness t2 of the second portion P2 ranges from 0.01 nm to 5 nm.

As illustrated in FIG. 1B, the second portion P2 of the passivation layer PA is formed to have curved corners. That is, corner rounding occurs at the turning point of the second portion P2 of the passivation layer PA. However, the disclosure is not limited thereto. In some alternative embodiments, the second portion P2 of the passivation layer PA may have sharp corners. That is, the profile of the second portion P2 of the passivation layer PA substantially follows the profile of the second material layer M2.

Figure 1C:
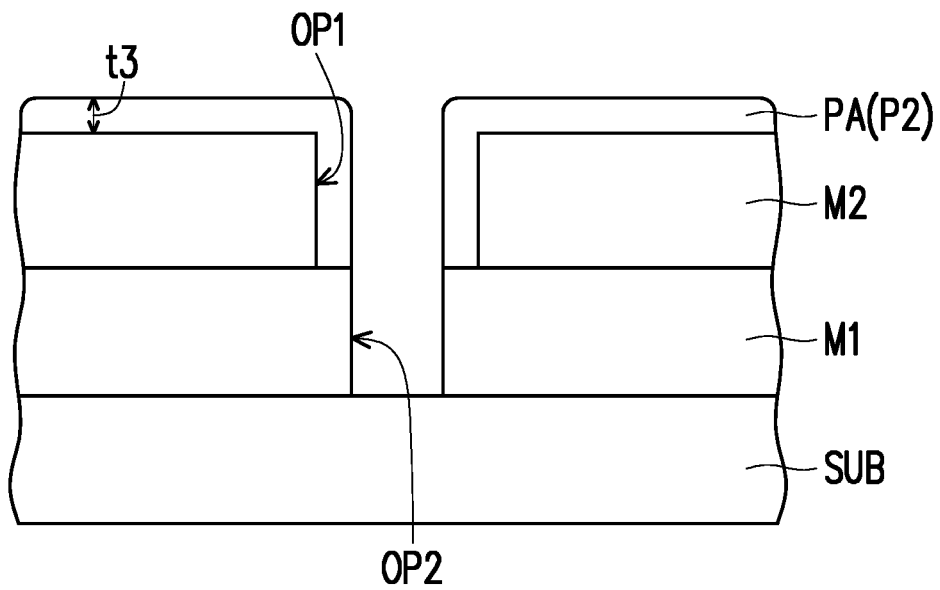

Referring to FIG. 1B and FIG. 1C, a first etching process is performed to remove a portion of the passivation layer PA and a portion of the first material layer M1. For example, the first portion P1 of the passivation layer P1 and the first material layer M1 directly underneath the first portion P1 of the passivation layer P1 are removed by the first etching process. In some embodiments, the first etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and TMAH, or the like. On the other hand, the dry etch process includes, for example, reactive ion etch (RIE), inductively coupled plasma (ICP) etch, electron cyclotron resonance (ECR) etch, neutral beam etch (NBE), and/or the like.

In some embodiments, an etching selectivity between the first material layer M1 and the passivation layer PA is higher than the etching selectivity between the first material layer M1 and the second material layer M2. For example, the etching selectivity between the first material layer M1 and the passivation layer PA ranges between 2:1 and 8:1. Herein, the etching selectivity is denoted by a ratio between an etch rate of the first material layer M1 and an etch rate of the passivation layer PA.

In some embodiments, during the first etching process, the second portion P2 of the passivation layer PA is also partially removed. For example, after the first etching process, the second portion P2 of the passivation layer PA has a thickness t3 that is smaller than the original thickness t2. In some embodiments, the thickness t3 ranges from 0.01 nm to 3 nm. In some embodiments, after the first etching process, a second opening OP2 is formed in the first material layer M1 to expose the substrate SUB. That is, the first material layer M1 is patterned. In some embodiments, the second opening OP2 of the first material layer M1 has substantially straight sidewalls. In some embodiments, the sidewalls of the second opening OP2 flush with sidewalls of the remaining passivation layer PA (i.e. the second portion P2 of the passivation layer PA). In some embodiments, since the first material layer M1 located within the first opening OP1 is being partially covered by the second portion P2 of the passivation layer PA, the area of the first material layer M1 subjected to the etchant is smaller than the area of the first opening OP1. As a result, a size of the second opening OP2 is smaller than a size of the first opening OP1. In some embodiment, the deposition of the passivation layer PA and the first etching process are in-situ processes. That is, the deposition of the passivation layer PA and the first etching process are performed in the same process chamber.

In some embodiments, since the passivation layer PA covers the second material layer M2, the passivation layer PA serves as a protection mechanism for the second material layer M2 from being damaged by the etchant during the first etching process when the etching selectivity between the first material layer M1 and the second material layer M2 is low. As such, the first material layer M1 may be patterned without damaging the second material layer M2. Moreover, since the passivation layer PA is formed by MLD, the deposition of the passivation layer PA on the second material layer M2 is uniform. As such, the etchant may be evenly distributed on the first material layer M1 to render a straight profile of the resulting patterns of the first material layer M1. That is, bowing during etch transfer due to polymer clogging in the conventional etching may be eliminated, thereby resolving the problem of undesired etching profile and the issue of iso/dense loading.

Figure 1D:
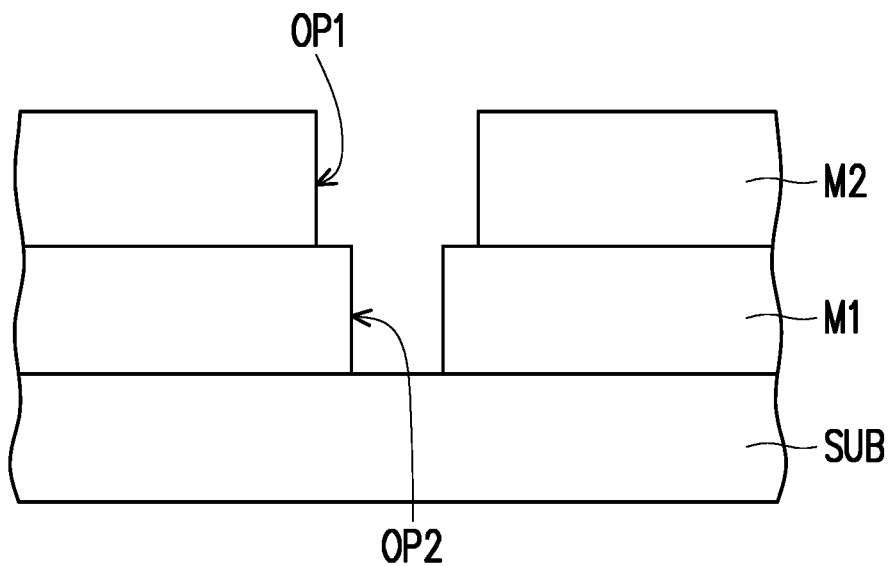

Referring to FIG. 1C and FIG. 1D, a second etching process is performed to remove the second portion P2 of the passivation layer PA. In some embodiments, the second etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and TMAH, or the like. On the other hand, the dry etch process includes, for example, reactive ion etch (RIE), inductively coupled plasma (ICP) etch, electron cyclotron resonance (ECR) etch, neutral beam etch (NBE), and/or the like. In some embodiments, the second etching process is optional. For example, in some applications, removal of the passivation layer PA is unnecessary, so the second etching process may be omitted.

Figure 2A:
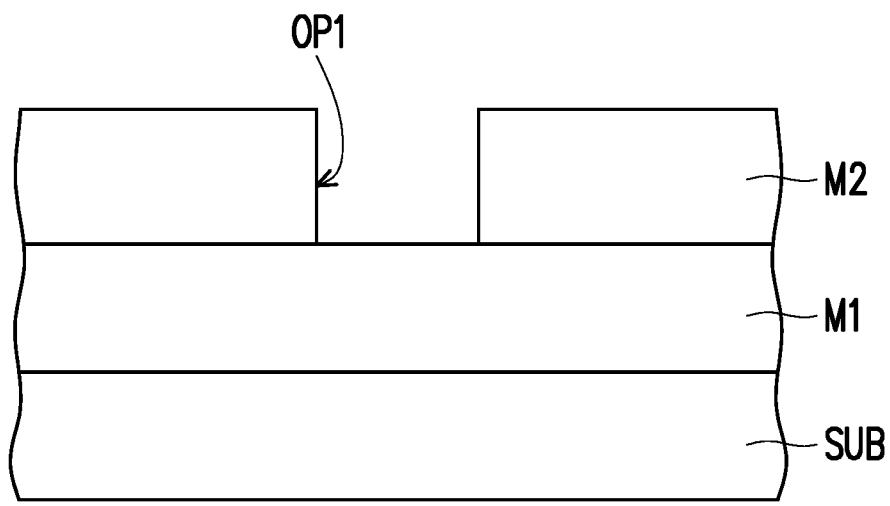
FIG. 2A to FIG. 2E are schematic cross-sectional views illustrating a patterning method in accordance with some alternative embodiments of the disclosure.

FIG. 2A to FIG. 2E are schematic cross-sectional views illustrating a patterning method in accordance with some alternative embodiments of the disclosure. Referring to FIG. 2A, a first material layer M1 and a second material layer M2 are provided on a substrate SUB. In some embodiments, the second material layer M2 is over the first material layer M1. For example, the second material layer M2 is directly in contact with the first material layer M1. In some embodiments, the second material layer M2 partially exposes the first material layer M1. For example, the second material layer M2 has a first opening OP1 which exposes a portion of the first material layer M1. The first material layer M1, the second material layer M2, and the substrate SUB in FIG. 2A are respectively similar to the first material layer M1, the second material layer M2, and the substrate SUB in FIG. 1A, so the detailed descriptions thereof are omitted herein.

Figure 2B:
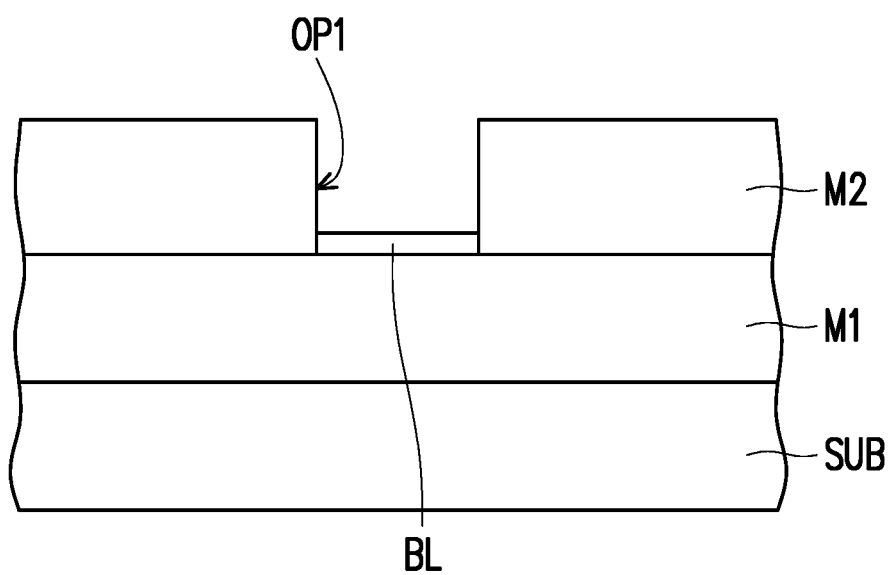

Referring to FIG. 2B, a blocking layer BL is formed over the first material layer M1. For example, the blocking layer BL is deposited over the exposed first material layer M1. That is, the blocking layer BL is disposed on a bottom surface of the first opening OP1. In some embodiments, the blocking layer BL includes self-assembled monolayers (SAM), polymer brushes, the like, or a combination thereof. In some embodiments, the SAM typically includes —SH or —OH functional groups. On the other hand, the polymer brush includes poly(ethylene oxide) (PEO), poly(ε-caprolactone) (PCL), poly(vinyl alcohol), the like, or a combination thereof. As illustrated in FIG. 2B, the blocking layer BL is selectively grown on the first material layer M1. Meanwhile, the blocking layer BL is not formed on the second material layer M2.

Figure 2C:
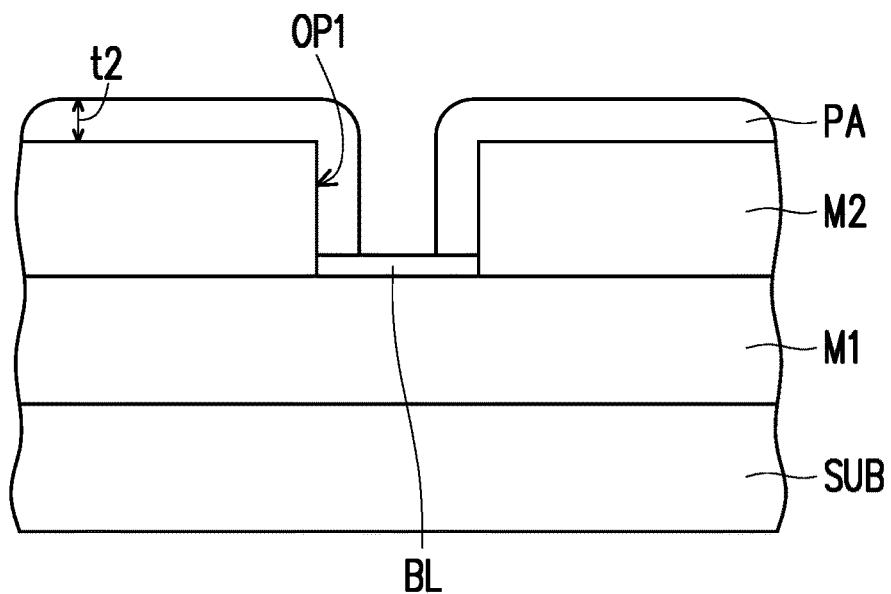

Referring to FIG. 2C, a passivation layer PA is formed over the second material layer M2. The passivation layer PA in FIG. 2C is similar to the passivation layer PA in FIG. 1B, so the detailed description thereof is omitted herein. In some embodiments, since the exposed portion of the first material layer M1 is covered by the blocking layer BL prior to the formation of the passivation layer PA, the blocking layer BL may serve as a blocking mechanism to prevent the passivation layer PA from growing on the first material layer M1. That is, the passivation layer PA is selectively formed on the second material layer M2. As illustrated in FIG. 2C, the passivation layer PA covers a top surface of the second material layer M2 and sidewalls of the first opening OP1. Moreover, the passivation layer PA also partially covers the blocking layer BL. In some embodiments, the passivation layer PA is conformally formed on the second material layer M2. For example, the passivation layer PA has a uniform thickness t2. In some embodiments, the thickness t2 of the passivation layer PA ranges from 0.01 nm to 5 nm.

As illustrated in FIG. 2C, the passivation layer PA is formed to have curved corners. That is, corner rounding occurs at the turning point of the passivation layer PA. However, the disclosure is not limited thereto. In some alternative embodiments, the passivation layer PA may have sharp corners. That is, the profile of the passivation layer PA substantially follows the profile of the second material layer M2.

Figure 2D:
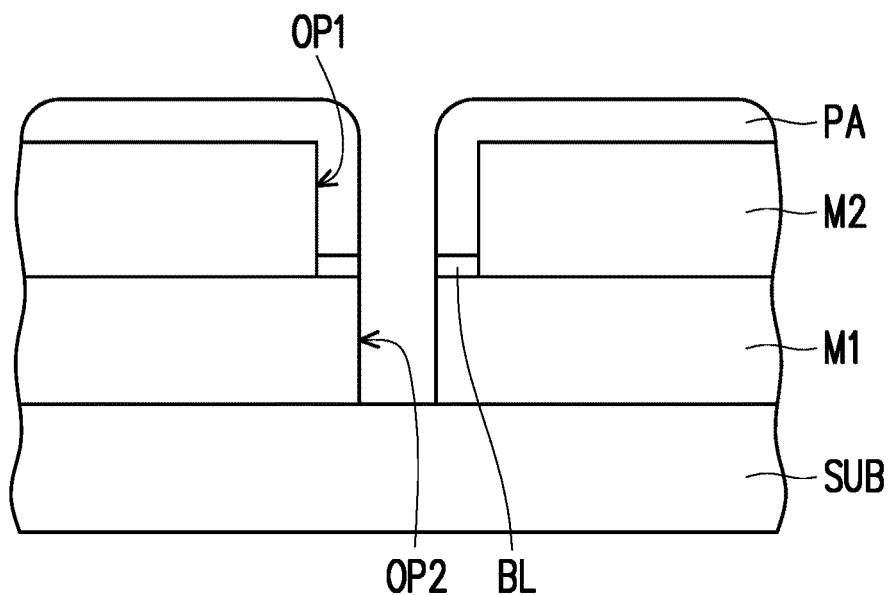

Referring to FIG. 2C and FIG. 2D, a first etching process is performed to remove a portion of the blocking layer BL and a portion of the first material layer M1. For example, the blocking layer BL exposed by the passivation layer PA and the first material layer M1 directly underneath the exposed blocking layer BL are removed by the first etching process. That is, the first etching process removes the first material layer M1 that is uncovered by the passivation layer PA. The first etching process in FIG. 2D is similar to the first etching process in FIG. 1C, so the detailed description thereof is omitted herein.

Depending on the etchant, the passivation layer PA may not be damaged during the first etching process. That is, the passivation layer PA is not being etched off at all during the first etching process. However, the disclosure is not limited thereto. In some alternative embodiments, the passivation layer PA may be slightly etched during the first etching process.

In some embodiments, after the first etching process, a second opening OP2 is formed in the first material layer M1 to expose the substrate SUB. That is, the first material layer M1 is patterned. In some embodiments, the second opening OP2 of the first material layer M1 has substantially straight sidewalls. In some embodiments, the sidewalls of the second opening OP2 flush with sidewalls of the remaining passivation layer PA and sidewalls of the remaining blocking layer BL. In some embodiments, a size of the second opening OP2 is smaller than a size of the first opening OP1. In some embodiment, the deposition of the passivation layer PA and the first etching process are in-situ processes. That is, the deposition of the passivation layer PA and the first etching process are performed in the same process chamber.

In some embodiments, since the passivation layer PA covers the second material layer M2, the passivation layer PA serves as a protection mechanism for the second material layer M2 from being damaged by the etchant during the first etching process when the etching selectivity between the first material layer M1 and the second material layer M2 is low. As such, the first material layer M1 may be patterned without damaging the second material layer M2. Moreover, since the passivation layer PA is formed by MLD, the deposition of the passivation layer PA on the second material layer M2 is uniform. As such, the etchant may be evenly distributed on the blocking layer BL and the first material layer M1 to render a straight profile of the resulting patterns of the first material layer M1. That is, bowing during etch transfer due to polymer clogging in the conventional etching may be eliminated, thereby resolving the problem of undesired etching profile and the issue of iso/dense loading.

Figure 2E:
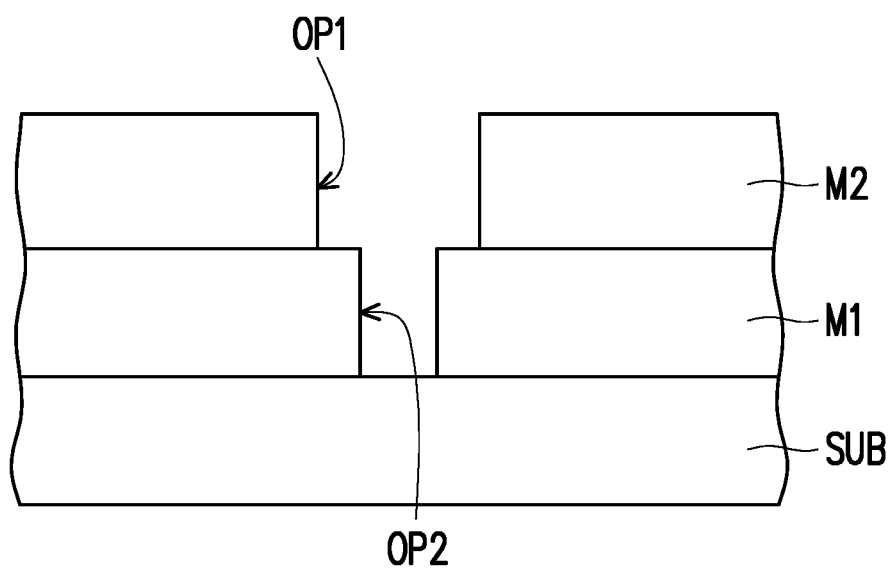

Referring to FIG. 2D and FIG. 2E, a second etching process is performed to remove the passivation layer PA and the remaining blocking layer BL. The second etching process in FIG. 2E is similar to the second etching process in FIG. 1D, so the detailed description thereof is omitted herein. In some embodiments, the second etching process is optional. For example, in some applications, removal of the passivation layer PA is unnecessary, so the second etching process may be omitted.

Figure 3A:
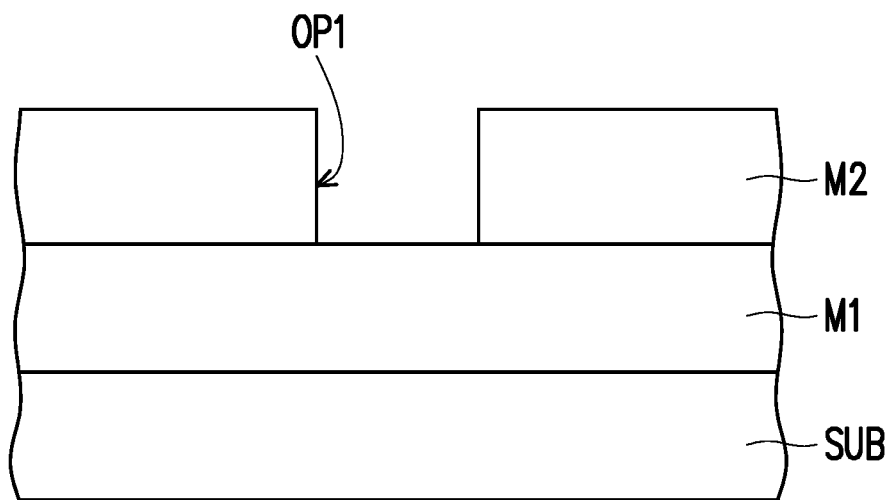
FIG. 3A to FIG. 3E are schematic cross-sectional views illustrating a patterning method in accordance with some alternative embodiments of the disclosure.

FIG. 3A to FIG. 3E are schematic cross-sectional views illustrating a patterning method in accordance with some alternative embodiments of the disclosure. Referring to FIG. 3A, a first material layer M1 and a second material layer M2 are provided on a substrate SUB. In some embodiments, the second material layer M2 is over the first material layer M1. For example, the second material layer M2 is directly in contact with the first material layer M1. In some embodiments, the second material layer M2 partially exposes the first material layer M1. For example, the second material layer M2 has a first opening OP1 which exposes a portion of the first material layer M1. The first material layer M1, the second material layer M2, and the substrate SUB in FIG. 3A are respectively similar to the first material layer M1, the second material layer M2, and the substrate SUB in FIG. 1A, so the detailed descriptions thereof are omitted herein.

Figure 3B:
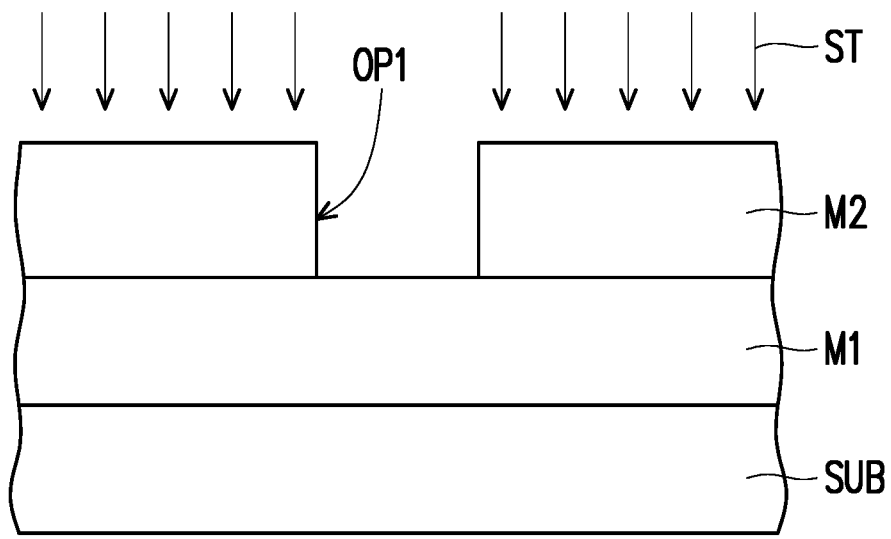

Referring to FIG. 3B, a surface treatment process ST is performed on the second material layer M2. In some embodiments, the surface treatment process ST includes a plasma treatment process, a silylation treatment process, or the like. In some embodiments, the plasma treatment process includes direct plasma treatment, remote plasma treatment, chemical treatment, the like, at various pressure regimes, or a combination thereof. On the other hand, the silylation treatment process typically includes a process of introducing substituted silyl group ($R_3Si$) onto surfaces of the second material layer M2. In some embodiments, the surface treatment process ST is only performed on the second material layer M2, and the first material layer M1 is untreated. For example, the surface treatment process ST can be precisely controlled such that the treatment is only performed on the second material layer M2. Alternately, a protection layer (not shown) may be formed over the first material layer M1 to prevent the first material layer M1 from being treated by the surface treatment process ST. However, the disclosure is not limited thereto. In some alternative embodiments, the surface treatment process ST may be performed globally on both of the first material layer M1 and the second material layer M2. Nevertheless, depending on the material, the first material layer M1 is not reactive to the surface treatment process ST, and only the second material layer M2 is reactive to the surface treatment process ST. As a result, only the second material layer M2 is treated.

Figure 3C:
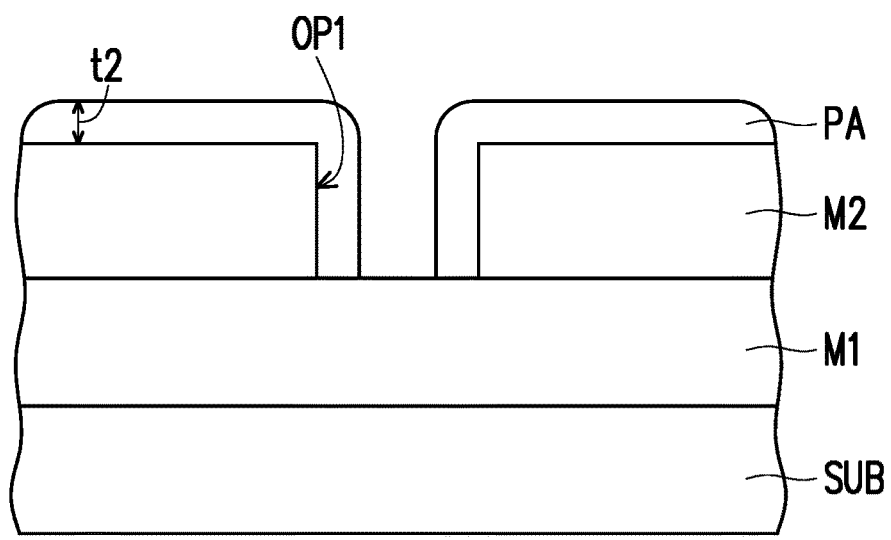

Referring to FIG. 3C, a passivation layer PA is formed over the second material layer M2. The passivation layer PA in FIG. 3C is similar to the passivation layer PA in FIG. 1B, so the detailed description thereof is omitted herein. In some embodiments, the surface treatment process ST alters the surface energy of the second material layer M2 such that the passivation layer PA is only formed on the second material layer M2. That is, the passivation layer PA is selectively formed on the second material layer M2. As illustrated in FIG. 3C, the passivation layer PA covers a top surface of the second material layer M2 and sidewalls of the first opening OP1. In some embodiments, the passivation layer PA is conformally formed on the second material layer M2. For example, the passivation layer PA has a uniform thickness t2. In some embodiments, the thickness t2 of the passivation layer PA ranges from 0.01 nm to 5 nm.

As illustrated in FIG. 3C, the passivation layer PA is formed to have curved corners. That is, corner rounding occurs at the turning point of the passivation layer PA. However, the disclosure is not limited thereto. In some alternative embodiments, the passivation layer PA may have sharp corners. That is, the profile of the passivation layer PA substantially follows the profile of the second material layer M2.

It should be noted that the surface treatment process ST and the growth of the passivation layer PA shown in FIG. 3B and FIG. 3C merely serve as exemplary illustrations, and the disclosure is not limited thereto. Depending on the type of surface treatment process ST and the material of the passivation layer PA, the processes shown in FIG. 3B and FIG. 3C may be altered. For example, in some alternative embodiments, the first material layer M1 is treated by the surface treatment process ST while the second material layer M2 is untreated. Subsequently, the passivation layer PA is only formed on the untreated second material layer M2, and is not formed on the treated first material layer M1.

Figure 3D:
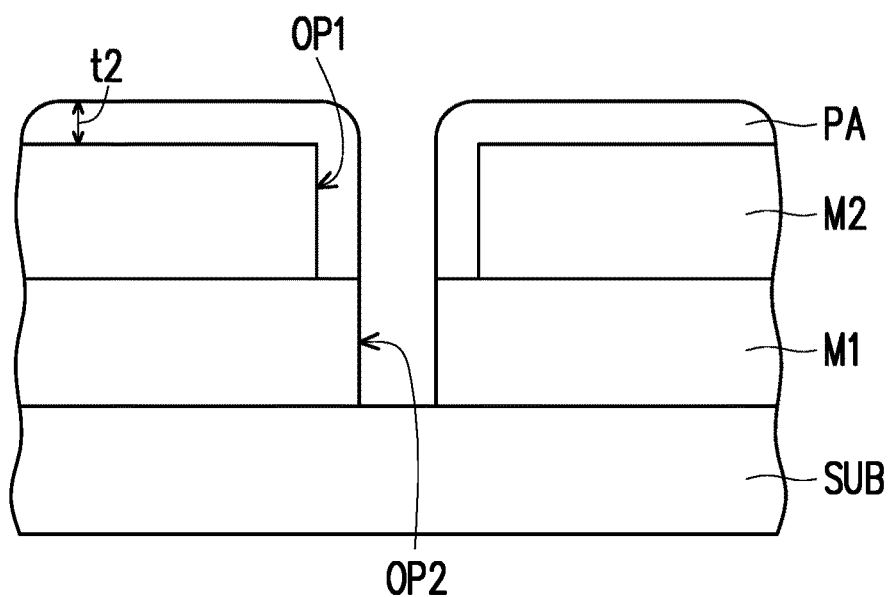

Referring to FIG. 3C and FIG. 3D, a first etching process is performed to remove a portion of the first material layer M1. For example, the first material layer M1 exposed by the passivation layer PA is removed by the first etching process. That is, the first etching process removes the first material layer M1 that is uncovered by the passivation layer PA. The first etching process in FIG. 3D is similar to the first etching process in FIG. 1C, so the detailed description thereof is omitted herein.

Depending on the etchant, the passivation layer PA may not be damaged during the first etching process. That is, the passivation layer PA is not being etched off at all during the first etching process. However, the disclosure is not limited thereto. In some alternative embodiments, the passivation layer PA may be slightly etched during the first etching process.

In some embodiments, after the first etching process, a second opening OP2 is formed in the first material layer M1 to expose the substrate SUB. That is, the first material layer M1 is patterned. In some embodiments, the second opening OP2 of the first material layer M1 has substantially straight sidewalls. In some embodiments, the sidewalls of the second opening OP2 flush with sidewalls of the passivation layer PA. In some embodiments, a size of the second opening OP2 is smaller than a size of the first opening OP1. In some embodiment, the deposition of the passivation layer PA and the first etching process are in-situ processes. That is, the deposition of the passivation layer PA and the first etching process are performed in the same process chamber.

In some embodiments, since the passivation layer PA covers the second material layer M2, the passivation layer PA serves as a protection mechanism for the second material layer M2 from being damaged by the etchant during the first etching process when the etching selectivity between the first material layer M1 and the second material layer M2 is low. As such, the first material layer M1 may be patterned without damaging the second material layer M2. Moreover, since the passivation layer PA is formed by MLD, the deposition of the passivation layer PA on the second material layer M2 is uniform. As such, the etchant may be evenly distributed on the first material layer M1 to render a straight profile of the resulting patterns of the first material layer M1. That is, bowing during etch transfer due to polymer clogging in the conventional etching may be eliminated, thereby resolving the problem of undesired etching profile and the issue of iso/dense loading.

Figure 3E:
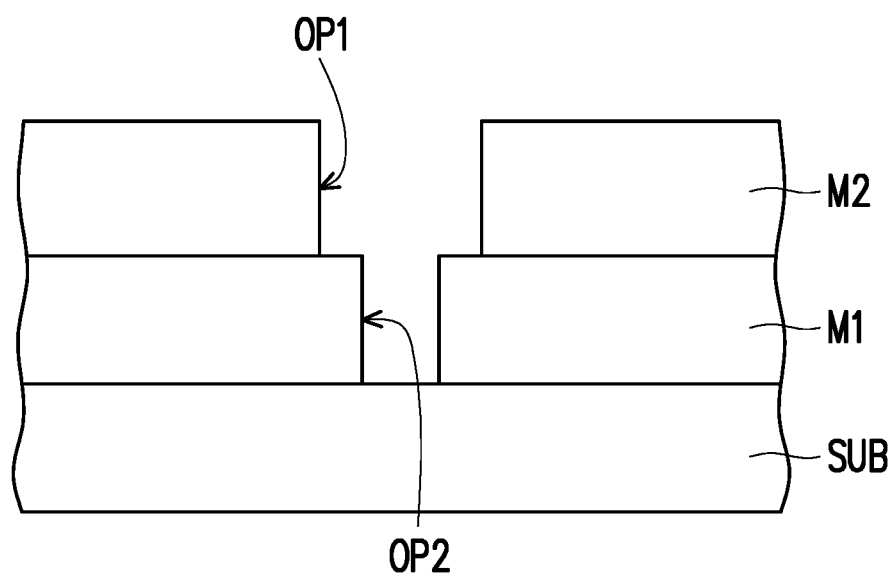

Referring to FIG. 3D and FIG. 3E, a second etching process is performed to remove the passivation layer PA. The second etching process in FIG. 3E is similar to the second etching process in FIG. 1D, so the detailed description thereof is omitted herein. In some embodiments, the second etching process is optional. For example, in some applications, removal of the passivation layer PA is unnecessary, so the second etching process may be omitted.

Figure 4A:
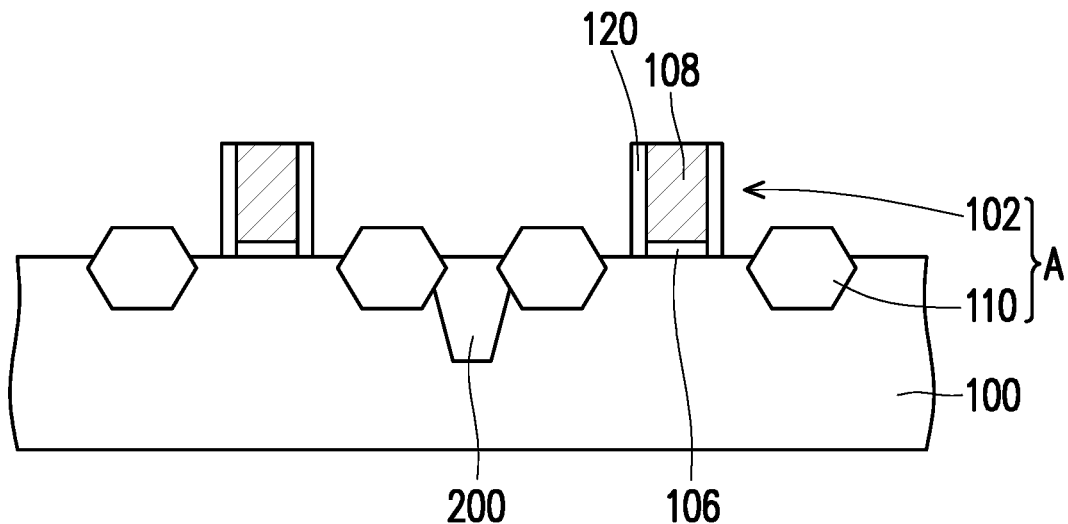
FIG. 4A to FIG. 4I are schematic cross-sectional views illustrating a manufacturing process of a semiconductor device in accordance with some embodiments of the disclosure.

FIG. 4A to FIG. 4I are schematic cross-sectional views illustrating a manufacturing process of a semiconductor device 10 in accordance with some embodiments of the disclosure. Referring to FIG. 4A, a substrate 100 is provided. In some embodiments, a material of the substrate 100 includes silicon, an alloy semiconductor such as silicon germanium, silicon germanium carbide, gallium arsenic phosphide, or gallium indium phosphide, or other semiconductor materials. In some alternative embodiments, the substrate 100 may be a semiconductor on insulator such as silicon on insulator (SOI) or silicon on sapphire. Alternatively or additionally, the substrate 100 includes other elementary semiconductor materials such as germanium, gallium arsenic, or other suitable semiconductor materials. In some embodiments, the substrate 100 further includes other features such as various doped regions, a buried layer, and/or an epitaxy layer. For example, the substrate 100 includes various doped regions (e.g., p-type wells or n-type wells) depending on design requirements. The doped regions are doped with p-type dopants, such as boron or $BF_2$, and/or n-type dopants, such as phosphorus or arsenic. Moreover, the doped regions may be formed directly on the substrate 100, in a P-well structure, in an N-well structure, in a dual-well structure, or using a raised structure.

In some embodiments, a plurality of metal-oxide semiconductor (MOS) transistors A is formed over the substrate 100. In some embodiments, each MOS transistor A includes a gate structure 102 and source/drain (S/D) regions 110. For example, the substrate 100 has dopant regions and epitaxial layers formed in the S/D regions 110. In some embodiments, the S/D regions 110 are doped with p-type dopants. However, the disclosure is not limited thereto. In some alternative embodiments, the S/D regions are doped with n-type dopants. In some embodiments, the dopant are doped into the S/D regions 110 through ion implantation. In some alternative embodiments, part of the substrate 100 is removed through etching or other suitable processes and the dopants are formed in the hollowed area through epitaxy growth. The epitaxial layers include SiGe, SiC, or other suitable materials.

In some embodiments, the gate structure 102 includes a gate dielectric layer 106, a gate electrode 108, and spacers 120. The gate dielectric layer 106 and the gate electrode 108 are formed over the substrate 100 in sequential order from bottom to top. The gate dielectric layer 106 includes silicon oxide, silicon nitride, silicon oxynitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the gate dielectric layer 106 is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof.

In some embodiment, the gate electrode 108 is made of polysilicon. In some embodiments, the gate electrode 108 serves as a dummy gate electrode. A metal gate electrode (or called "replacement gate") would replace the dummy gate electrode in subsequent steps.

In some embodiments, the spacers 120 are formed over sidewalls of the gate electrode 108 and sidewalls of the gate dielectric layer 106. The spacers 120 are formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The spacers 120 may have a multi-layer structure which includes one or more liner layers. The liner layer includes a dielectric material such as silicon oxide, silicon nitride, and/or other suitable materials. The formation of the spacers 120 can be achieved by depositing suitable dielectric material and anisotropically etching off the dielectric material.

As illustrated in FIG. 4A, the substrate 100 also includes isolation regions 200, which are formed to isolate adjacent MOS transistors A. The isolation regions 200 utilize isolation technology, such as local oxidation of silicon (LOCOS) or shallow trench isolation (STI) to electrically isolate various regions. If the isolation regions 200 are made of STIs, the STI region includes silicon oxide, silicon nitride, silicon oxynitride, other suitable materials, or a combination thereof. In some embodiments, the filled trench has a multi-layer structure such as a thermal oxide liner layer filled with silicon nitride or silicon oxide. As illustrated in FIG. 4A, the MOS transistors A are planar MOS transistors. However, the disclosure is not limited thereto. In some alternative embodiments, the MOS transistors A may be Fin Field-Effect (FinFET) Transistors.

Figure 4B:
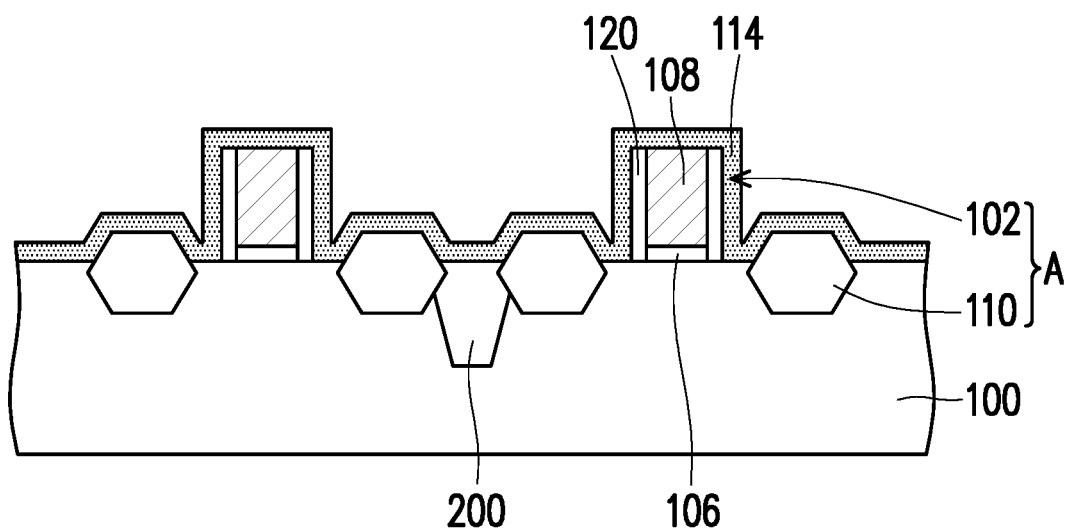

Referring to FIG. 4B, an etch stop layer 114 is formed over the MOS transistor A. In some embodiments, the etch stop layer 114 may be referred to as "contact etch stop layer (CESL)." In some embodiments, the etch stop layer 114 includes silicon nitride, carbon-doped silicon nitride, or a combination thereof. In some embodiments, the etch stop layer 114 is deposited using CVD, high density plasma (HDP) CVD, sub-atmospheric CVD (SACVD), MLD, or other suitable methods.

Figure 4C:
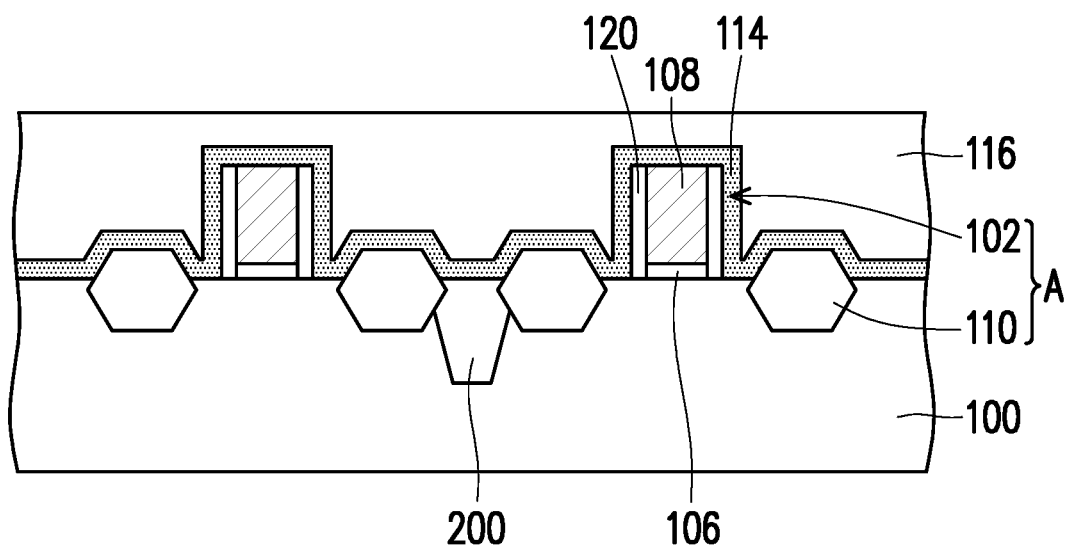

Referring to FIG. 4C, a dielectric layer 116 is formed over the etch stop layer 114. In some embodiments, the dielectric layer 116 may be referred to as "interlayer dielectric layer (ILD)." In some embodiments, the dielectric layer 116 includes silicon oxide, silicon oxynitride, carbon doped silicon oxide (e.g., SiCOH), and/or a combination thereof. In some embodiments, the dielectric layer 116 is formed to a suitable thickness by FCVD, CVD, HDPCVD, SACVD, spin-on, sputtering, or other suitable methods.

Figure 4D:
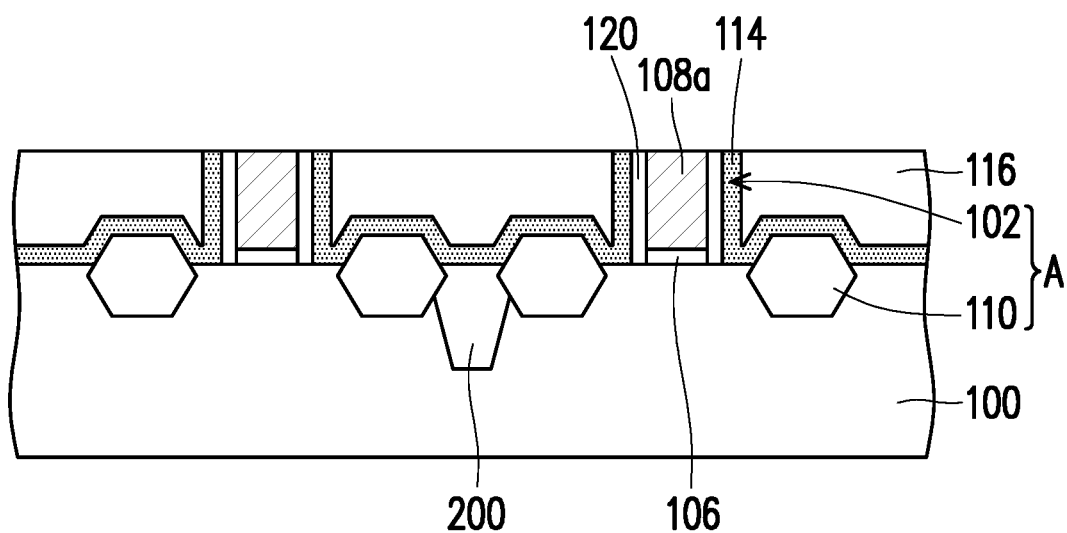

Referring to FIG. 4C and FIG. 4D, a portion of the dielectric layer 116 and a portion of the etch stop layer 114 are removed such that top surfaces of the gate electrodes 108 are exposed. The process of removing the portion of the dielectric layer 116 and the portion of the etch stop layer 114 is achieved by a chemical mechanical polishing (CMP) process, an etching process, or other suitable process.

In some embodiments, after the gate electrodes 108 are exposed, a gate replacement process is performed. For example, the gate electrodes 108 are replaced by metallic gate electrodes 108a. In some embodiments, the gate electrodes 108 may be removed through an etching process or other suitable processes. On the other hand, the gate electrodes 108a are formed by depositing a metal material through suitable processes such as ALD, CVD, PVD, plating, or a combination thereof. In some embodiments, the gate electrodes 108a include TiN, WN, TaN, Ru, Ti, Ag, Al, TiAl, TiAlN, TaC, TaCN, TaSiN, Mn, or Zr. Although not illustrated, the gate electrodes 108a may be a multi-layered structure. In other words, in some embodiments, each gate electrode 108a includes a barrier, a work function layer, or a combination thereof.

Figure 4E:
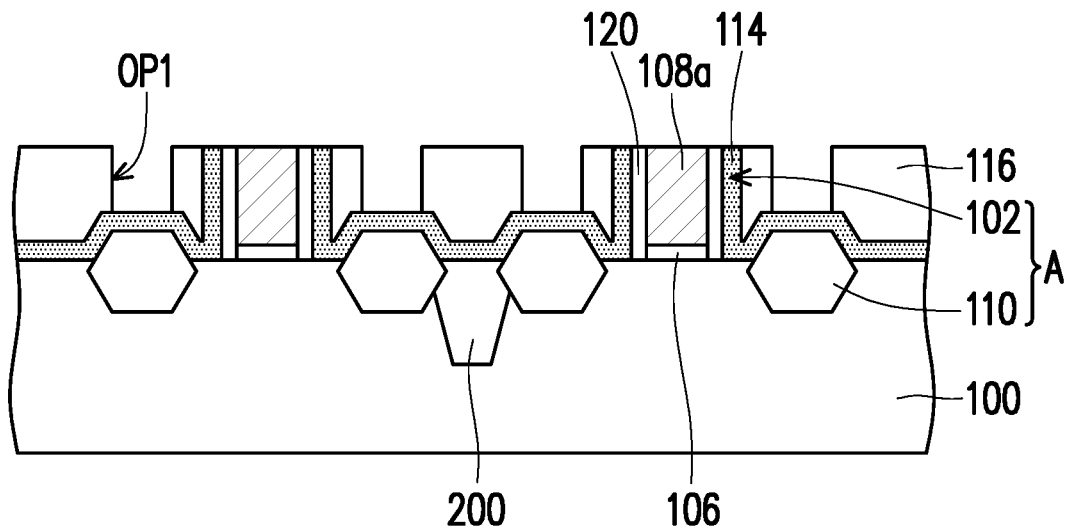

Referring to FIG. 4E to FIG. 4H, the dielectric layer 116 and the etch stop layer 114 are patterned through the patterning method illustrated in FIG. 1A to FIG. 1D. Referring to FIG. 4E, a plurality of first openings OP1 is formed in the dielectric layer 116. The first openings OP1 may be formed by a photolithography process and an etching process. As illustrated in FIG. 4E, the first openings OP1 of the dielectric layer 116 partially expose a portion of the etch stop layer 114. In some embodiments, the etch stop layer 114 corresponds to the first material layer M1 in FIG. 1A to FIG. 1D. On the other hand, the dielectric layer 116 corresponds to the second material layer M2 in FIG. 1A to FIG. 1D. For example, the etch stop layer 114 contains nitride while the dielectric layer 116 contains oxide.

Figure 4F:
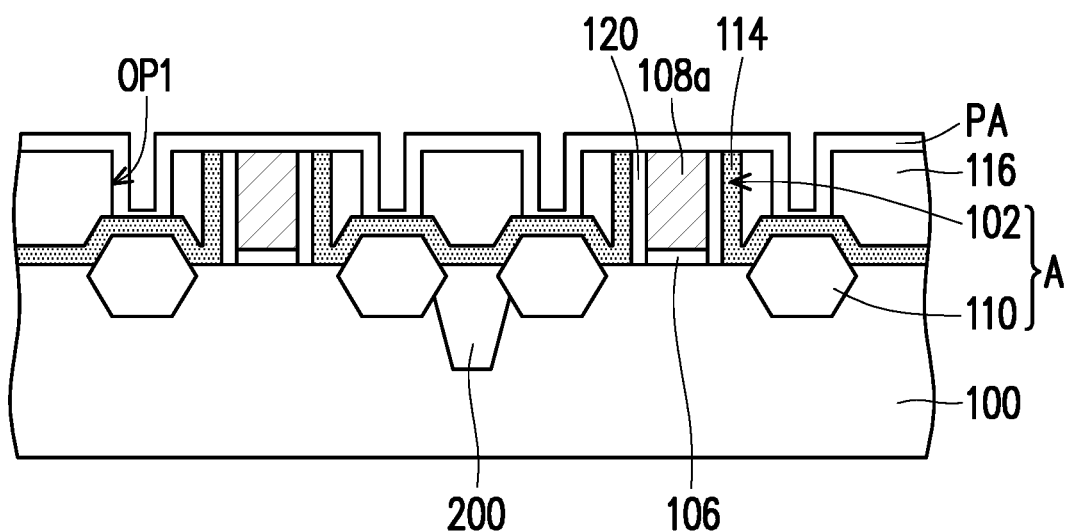

Referring to FIG. 4F, a passivation layer PA is formed over the dielectric layer 116, the etch stop layer 114, and the gate structure 102. In some embodiments, the passivation layer PA is formed over a top surface of the dielectric layer 116, sidewalls of the first opening OP1, and a bottom surface of the first opening OP1 (i.e. the exposed top surface of the etch stop layer 114). The passivation layer PA in FIG. 4F is similar to the passivation layer PA in FIG. 1B, so the detailed description thereof is omitted herein. In some embodiments, since the etch stop layer 114 and the dielectric layer 116 are made of different materials, a growth rate of the passivation layer PA on the dielectric layer 116 is different from a growth rate of the passivation layer PA on the etch stop layer 114. For example, the growth rate of the passivation layer PA on the dielectric layer 116 is greater than the growth rate of the passivation layer PA on the etch stop layer 114. As a result, the passivation layer PA formed on the dielectric layer 116 has a greater thickness than the passivation layer PA formed on the etch stop layer 114.

Figure 4G:
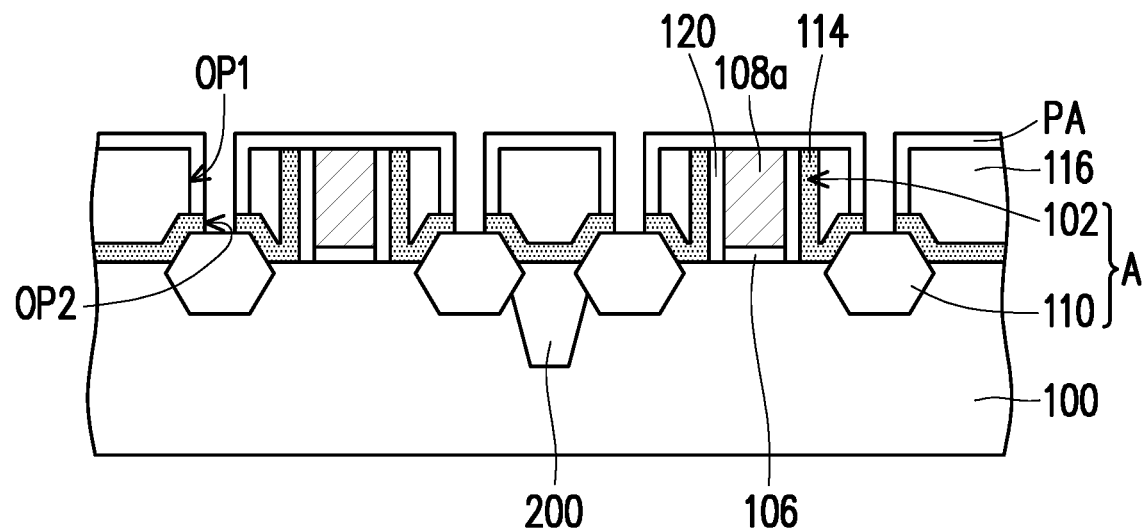

Referring to FIG. 4G, a first etching process is performed to remove a portion of the passivation layer PA and a portion of the etch stop layer 114. For example, the thinner portion of the passivation layer PA and the underlying etch stop layer 114 are removed. In some embodiments, during the first etching process, the thicker portion of the passivation layer PA is also partially removed. The first etching process in FIG. 4G may be similar to the first etching process in FIG. 1C, so the detailed description thereof is omitted herein. After the first etching process, a plurality of second openings OP2 is formed in the etch stop layer 114. That is, the etch stop layer 114 is patterned. In some embodiments, each second opening OP2 of the etch stop layer 114 has substantially straight sidewalls. In some embodiments, the sidewalls of the second openings OP2 flush with sidewalls of the remaining passivation layer PA. As illustrated in FIG. 4G, a size of each second opening OP2 is smaller than a size of each first opening OP1. In some embodiment, the deposition of the passivation layer PA and the first etching process are in-situ processes. That is, the deposition of the passivation layer PA and the first etching process are performed in the same process chamber.

Figure 4H:
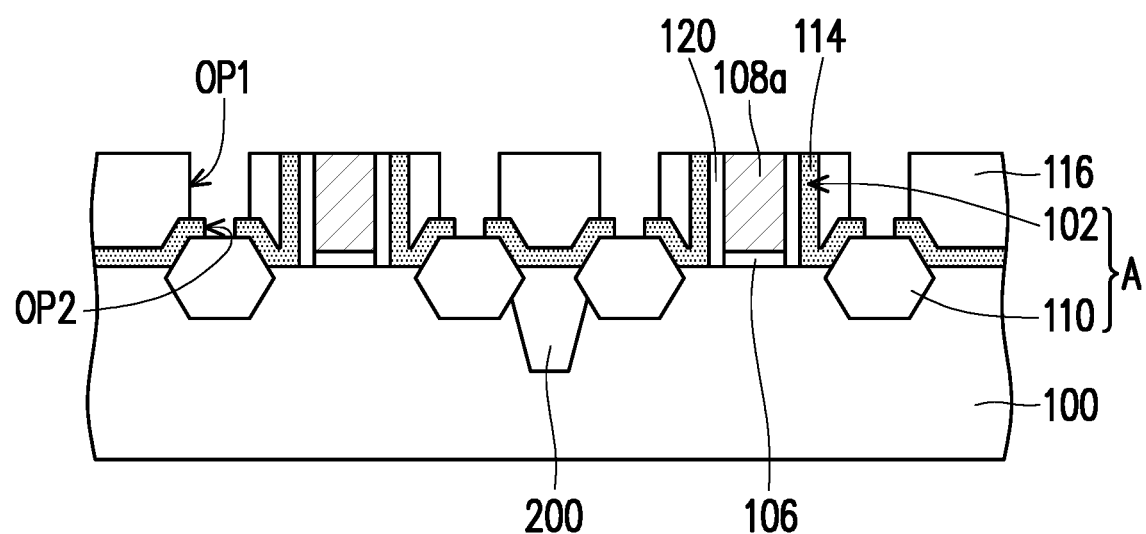

Referring to FIG. 4G and FIG. 4H, a second etching process is performed to remove the remaining passivation layer PA. The second etching process in FIG. 4H may be similar to the second etching process in FIG. 1D, so the detailed description thereof is omitted herein. It should be noted that in some embodiments, the second etching process is optional.

Figure 4I:
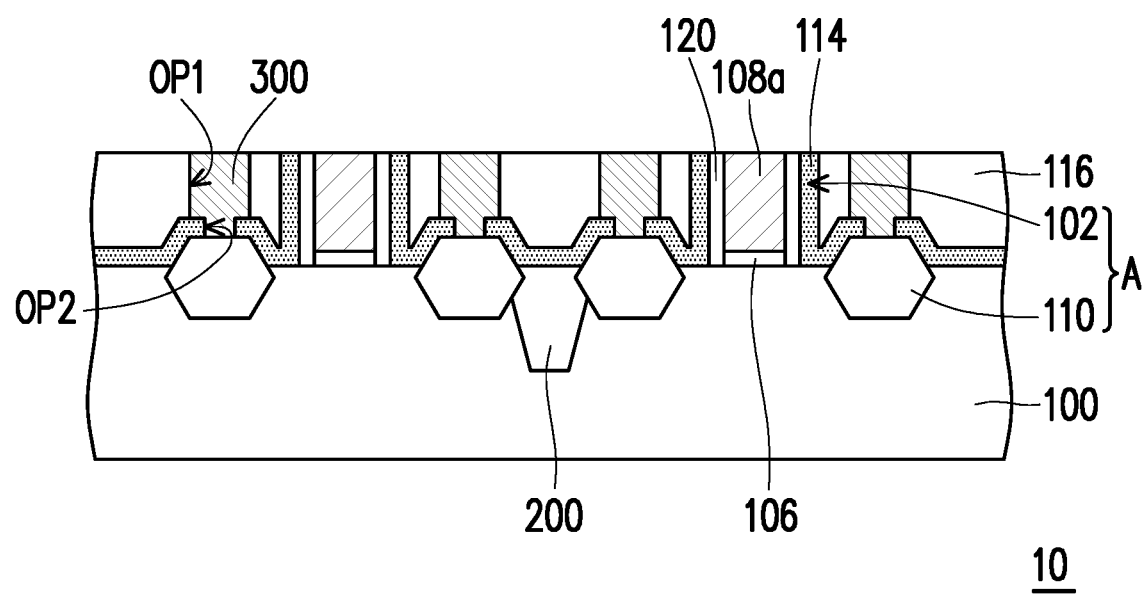

Referring to FIG. 4I, after the dielectric layer 116 and the etch stop layer 114 are patterned to respectively form the first openings OP1 and the second openings OP2, a conductive material is filled into the first openings OP1 and the second openings OP2 to form conductive contacts 300, so as to obtain a semiconductor device 10. In some embodiments, the conductive contacts 300 include metallic materials having excellent conductivity. For example, the conductive contacts 300 include copper, tungsten, cobalt, alloys thereof, or a combination thereof. As illustrated in FIG. 4I, the conductive contacts 300 are directly in contact with the S/D regions 110. In other words, the conductive contacts 300 are electrically connected to the S/D regions 110.

It should be noted that the processes of patterning the dielectric layer 116 and the etch stop layer 114 illustrated in FIG. 4E to FIG. 4H are merely exemplary illustrations, and the disclosure is not limited thereto. In some alternative embodiments, the dielectric layer 116 and the etch stop layer 114 may be patterned by other methods. These methods will be described below in conjunction with FIG. 5A to FIG. 5D and FIG. 6A to FIG. 6D.

FIG. 5A to FIG. 5D are schematic cross-sectional views illustrating intermediate stages of a manufacturing process of a semiconductor device 10 in accordance with some alternative embodiments of the disclosure. The process illustrated in FIG. 5A to FIG. 5D correspond to the patterning method illustrated in FIG. 2A to FIG. 2E. In some embodiments, the steps illustrated in FIG. 4F and FIG. 4H may be replaced by the steps illustrated in FIG. 5A to FIG. 5D.

Figure 5A:
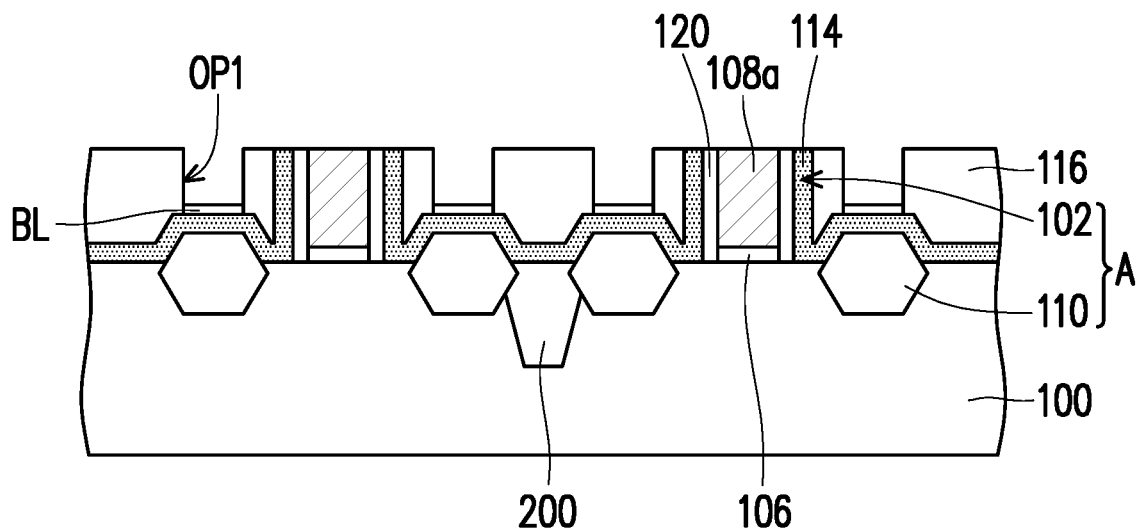
FIG. 5A to FIG. 5D are schematic cross-sectional views illustrating intermediate stages of a manufacturing process of a semiconductor device in accordance with some alternative embodiments of the disclosure.

Referring to FIG. 5A, a blocking layer BL is formed over the etch stop layer 114. For example, the blocking layer BL is deposited over the exposed etch stop layer 114. That is, the blocking layer BL is disposed on a bottom surface of the first opening OP1. The blocking layer BL in FIG. 5A is similar to the blocking layer BL in FIG. 2B, so the detailed description thereof is omitted herein.

Figure 5B:
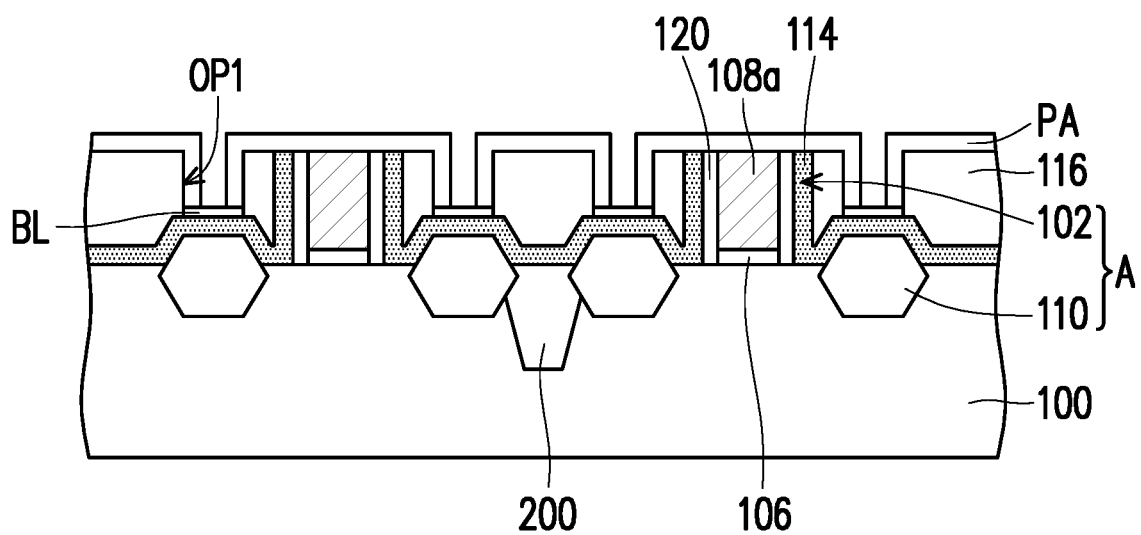

Referring to FIG. 5B, a passivation layer PA is formed over the dielectric layer 116. The passivation layer PA in FIG. 5B is similar to the passivation layer PA in FIG. 2C, so the detailed description thereof is omitted herein. In some embodiments, since the etch stop layer 114 exposed by the first openings OP1 is covered by the blocking layer BL prior to the formation of the passivation layer PA, the blocking layer BL may serve as a blocking mechanism to prevent the passivation layer PA from growing on the etch stop layer 114 exposed by the first openings OP1. That is, the passivation layer PA is selectively formed on the dielectric layer 116. As illustrated in FIG. 5B, the passivation layer PA covers a top surface of the dielectric layer 116 and sidewalls of the first openings OP1. Moreover, the passivation layer PA also partially covers the blocking layer BL. In some embodiments, the passivation layer PA is conformally formed on the dielectric layer 116.

Figure 5C:
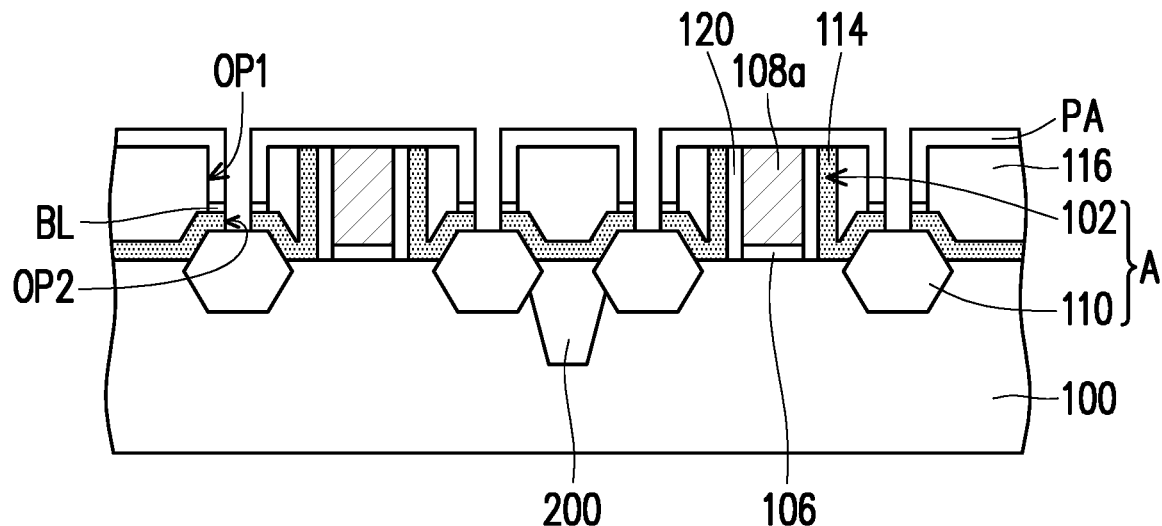

Referring to FIG. 5B and FIG. 5C, a first etching process is performed to remove a portion of the blocking layer BL and a portion of the etch stop layer 114. For example, the blocking layer BL exposed by the passivation layer PA and the etch stop layer 114 directly underneath the exposed blocking layer BL are removed by the first etching process. The first etching process in FIG. 5C is similar to the first etching process in FIG. 2D, so the detailed description thereof is omitted herein. Depending on the etchant, the passivation layer PA may not be damaged during the first etching process. That is, the passivation layer PA is not being etched off at all during the first etching process. However, the disclosure is not limited thereto. In some alternative embodiments, the passivation layer PA may be slightly etched during the first etching process.

In some embodiments, after the first etching process, a plurality of second openings OP2 is formed in the etch stop layer 114. That is, the etch stop layer 114 is patterned. In some embodiments, each second opening OP2 of the etch stop layer 114 has substantially straight sidewalls. In some embodiments, the sidewalls of the second openings OP2 flush with sidewalls of the remaining passivation layer PA and sidewalls of the remaining blocking layer BL. As illustrated in FIG. 5C, a size of each second opening OP2 is smaller than a size of each first opening OP1. In some embodiment, the deposition of the passivation layer PA and the first etching process are in-situ processes. That is, the deposition of the passivation layer PA and the first etching process are performed in the same process chamber.

Figure 5D:
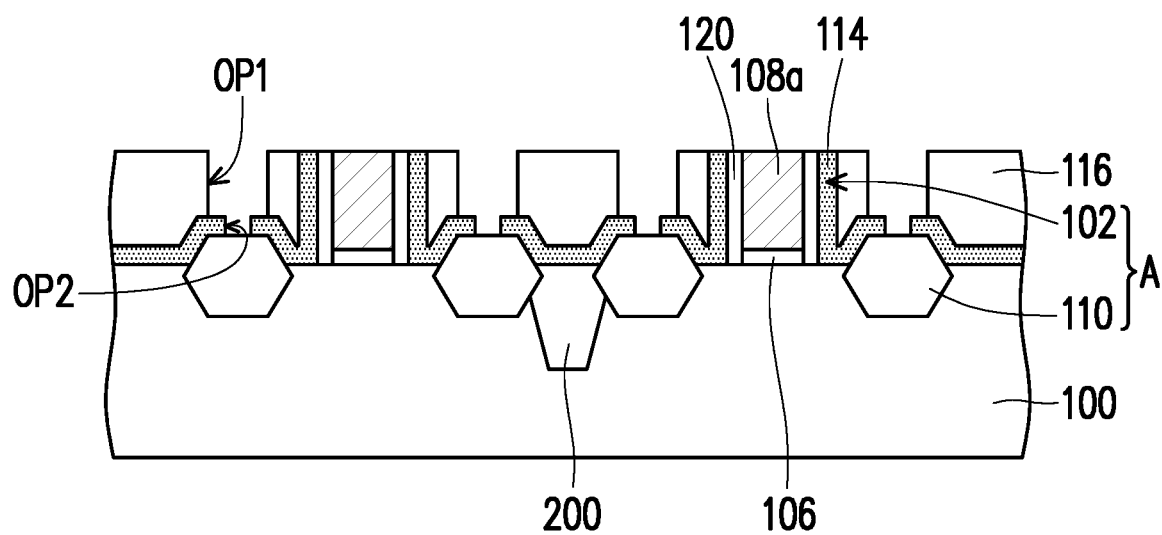

Referring to FIG. 5C and FIG. 5D, a second etching process is performed to remove the passivation layer PA and the remaining blocking layer BL. The second etching process in FIG. 5D is similar to the second etching process in FIG. 2E, so the detailed description thereof is omitted herein. It should be noted that in some embodiments, the second etching process is optional.

FIG. 6A to FIG. 6D are schematic cross-sectional views illustrating intermediate stages of a manufacturing process of a semiconductor device 10 in accordance with some alternative embodiments of the disclosure. The process illustrated in FIG. 6A to FIG. 6D correspond to the patterning method illustrated in FIG. 3A to FIG. 3E. In some embodiments, the steps illustrated in FIG. 4F and FIG. 4H may be replaced by the steps illustrated in FIG. 6A to FIG. 6D.

Figure 6A:
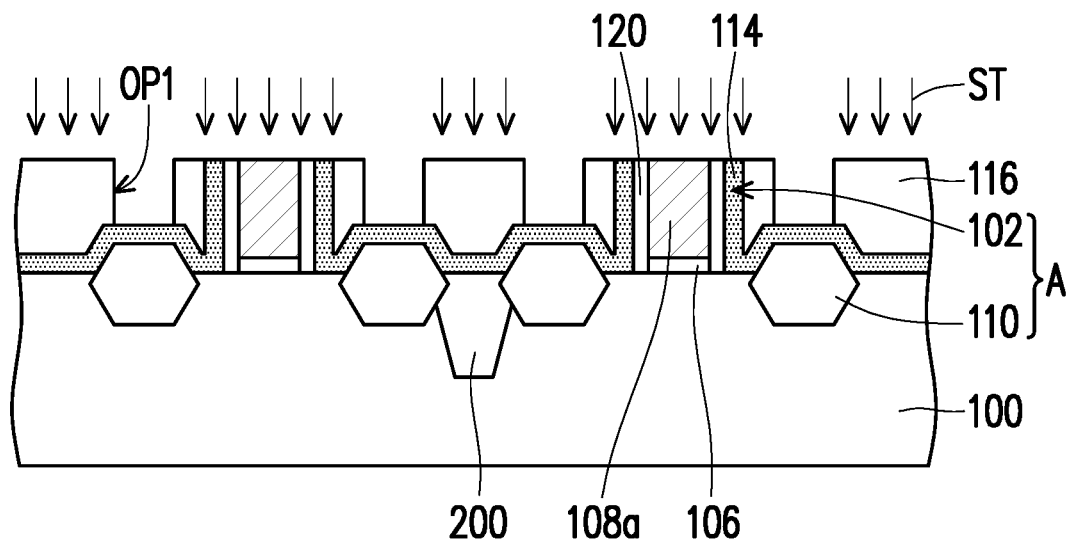
FIG. 6A to FIG. 6D are schematic cross-sectional views illustrating intermediate stages of a manufacturing process of a semiconductor device in accordance with some alternative embodiments of the disclosure.

Referring to FIG. 6A, a surface treatment process ST is performed on the dielectric layer 116. The surface treatment process ST in FIG. 6A is similar to the surface treatment process in FIG. 3B, so the detailed description thereof is omitted herein. In some embodiments, the surface treatment process ST is performed such that the dielectric layer 116 is treated and the etch stop layer 114 located within the first openings OP1 is untreated. For example, the surface treatment process ST can be precisely controlled such that the treatment is not performed on the etch stop layer 114 located within the first openings OP1. Alternately, a protection layer (not shown) may be formed over the etch stop layer 114 located within the first openings OP1 to prevent the etch stop layer 114 from being treated by the surface treatment process ST.

Figure 6B:
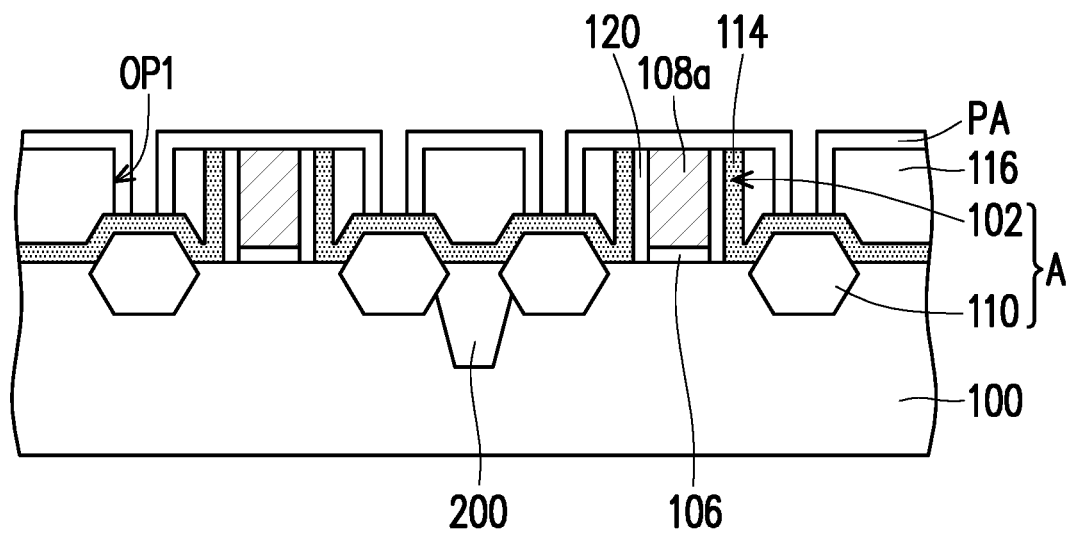

Referring to FIG. 6B, a passivation layer PA is formed over the dielectric layer 116. The passivation layer PA in FIG. 6B is similar to the passivation layer PA in FIG. 3C, so the detailed description thereof is omitted herein. In some embodiments, the surface treatment process ST alters the surface energy of the treated portions such that the passivation layer PA is only formed on the treated portion. That is, the passivation layer PA is selectively formed on the dielectric layer 116. On the other hand, the passivation layer PA is not formed on the etch stop layer 114 located within the first openings OP1. As illustrated in FIG. 6B, the passivation layer PA covers a top surface of the dielectric layer 116 and sidewalls of the first openings OP1. In some embodiments, the passivation layer PA is conformally formed on the dielectric layer 116.

It should be noted that the surface treatment process ST and the growth of the passivation layer PA shown in FIG. 6A and FIG. 6B merely serve as exemplary illustrations, and the disclosure is not limited thereto. Depending on the type of surface treatment process ST and the material of the passivation layer PA, the processes shown in FIG. 6A and FIG. 6B may be altered. For example, in some alternative embodiments, the etch stop layer 114 located in the first openings OP1 is treated by the surface treatment process ST while the dielectric layer 116 is untreated. Subsequently, the passivation layer PA is only formed on the untreated dielectric layer 116, and is not formed on the treated etch stop layer 114 located in the first openings OP1.

Figure 6C:
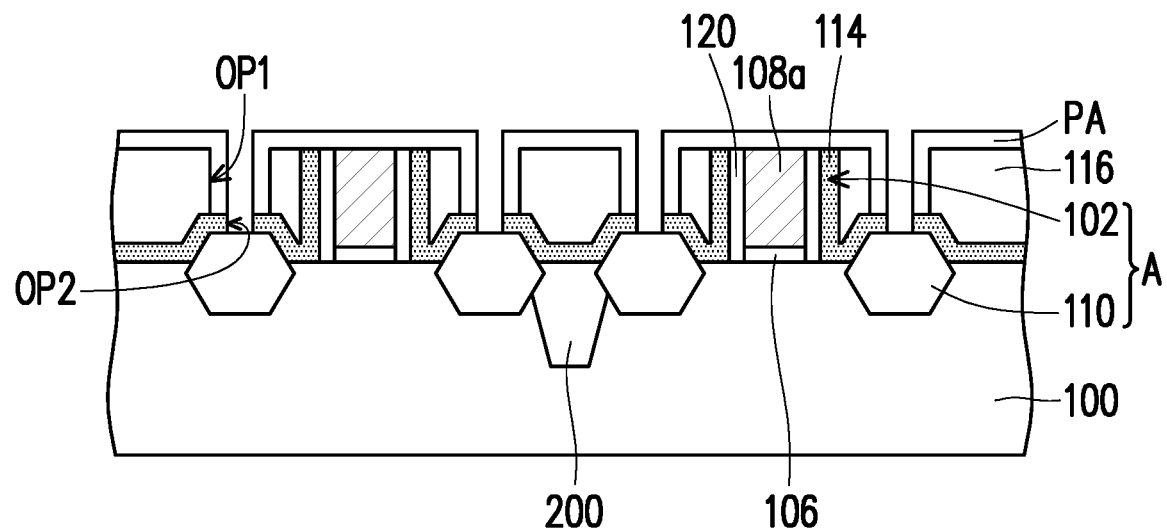

Referring to FIG. 6B and FIG. 6C, a first etching process is performed to remove a portion of the etch stop layer 114. For example, the etch stop layer 114 exposed by the passivation layer PA is removed by the first etching process. The first etching process in FIG. 6C is similar to the first etching process in FIG. 3D, so the detailed description thereof is omitted herein. Depending on the etchant, the passivation layer PA may not be damaged during the first etching process. That is, the passivation layer PA is not being etched off at all during the first etching process. However, the disclosure is not limited thereto. In some alternative embodiments, the passivation layer PA may be slightly etched during the first etching process.

In some embodiments, after the first etching process, a plurality of second openings OP2 is formed in the etch stop layer 114. That is, the etch stop layer 114 is patterned. In some embodiments, each second opening OP2 of the etch stop layer 114 has substantially straight sidewalls. In some embodiments, the sidewalls of the second openings OP2 flush with sidewalls of the passivation layer PA. As illustrated in FIG. 6C, a size of each second opening OP2 is smaller than a size of each first opening OP1. In some embodiment, the deposition of the passivation layer PA and the first etching process are in-situ processes. That is, the deposition of the passivation layer PA and the first etching process are performed in the same process chamber.

Figure 6D:
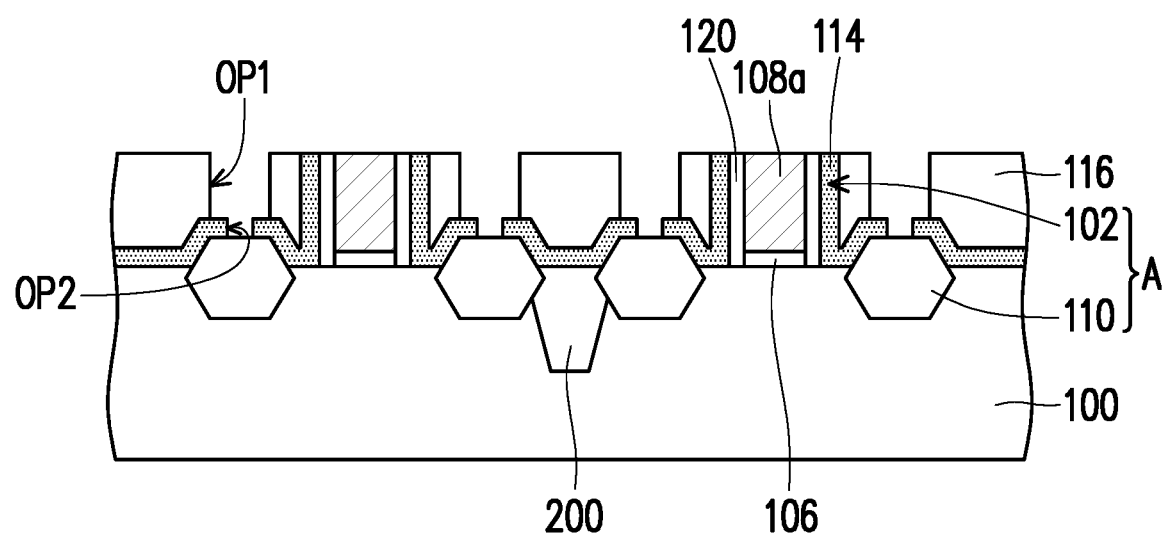

Referring to FIG. 6C and FIG. 6D, a second etching process is performed to remove the passivation layer PA. The second etching process in FIG. 6D is similar to the second etching process in FIG. 3E, so the detailed description thereof is omitted herein. It should be noted that in some embodiments, the second etching process is optional.

In accordance with some embodiments of the disclosure, a patterning method includes at least the following steps. A first material layer is provided. A second material layer is provided over the first material layer. The second material layer partially exposes the first material layer. A passivation layer is formed over the first material layer and the second material layer. A growth rate of the passivation layer on the second material layer is greater than a growth rate of the passivation layer on the first material layer. A first etching process is performed to remove a portion of the passivation layer and a portion of the first material layer.

In accordance with some alternative embodiments of the disclosure, a patterning method includes at least the following steps. A first material layer is provided. A second material layer is provided over the first material layer. The second material layer has an opening partially exposing the first material layer. A passivation layer is selectively formed on the second material layer to cover a top surface of the second material layer and sidewalls of the opening. A first etching process is performed to remove the first material layer that is uncovered by the passivation layer.

In accordance with some embodiments of the disclosure, a manufacturing method of a semiconductor device includes at least the following steps. A substrate is provided. A metal-oxide-semiconductor (MOS) transistor is formed over the substrate. An etch stop layer is formed over the MOS transistor. A dielectric layer is deposited over the etch stop layer. A first opening is formed in the dielectric layer to expose the etch stop layer. A passivation layer is formed over the dielectric layer and the etch stop layer. A growth rate of the passivation layer on the dielectric layer is greater than a growth rate of the passivation layer on the etch stop layer. An etching process is performed to remove a portion of the passivation layer and a portion of the etch stop layer to form a second opening in the etch stop layer. A conductive material is filled into the first opening and the second opening to form a conductive contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A patterning method, comprising:
   providing a first material layer;
   providing a second material layer over the first material layer, wherein the second material layer has an opening partially exposing the first material layer;
   selectively forming a passivation layer on the second material layer to cover a top surface of the second material layer and sidewalls of the opening, wherein a portion of the exposed first material layer is uncovered by the passivation layer;
   performing a first etching process to remove the portion of the exposed first material layer that is uncovered by the passivation layer; and
   performing a second etching process to remove the passivation layer.

2. The method of claim 1, further comprising:
   depositing a blocking layer over the exposed first material layer prior to the formation of the passivation layer on the second material layer.

3. The method of claim 2, wherein the passivation layer partially covers the blocking layer, and the first etching process removes the blocking layer exposed by the passivation layer.

4. The method of claim 3,
   wherein the second etching process further removes the remaining blocking layer that is not removed during the first etching process.

5. The method of claim 2, wherein the blocking layer comprises self-assembled monolayers (SAM) or polymer brushes.

6. The method of claim 1, wherein the passivation layer comprises an organometallic layer, and the organometallic layer comprises aluminum alkoxide, titanium alkoxide, or a combination thereof.

7. The method of claim 1, wherein the first material layer contains oxide and the second material layer contains nitride.

8. A patterning method, comprising:
   providing a substrate;
   providing a first material layer on the substrate;
   providing a second material layer over the first material layer, wherein the second material layer has a first opening partially exposing the first material layer;
   depositing a blocking layer in the first opening;
   forming a passivation layer in the first opening, wherein the passivation layer covers a top surface of the second material layer, a top surface of the blocking layer, and sidewalls of the first opening;
   performing a first etching process to remove a portion of the blocking layer and a portion of the first material layer to form a second opening exposing the substrate; and
   performing a second etching process to remove the passivation layer.

9. The method of claim 8, wherein the passivation layer partially covers the top surface of the blocking layer.

10. The method of claim 8, wherein the blocking layer is in physical contact with a bottom surface and sidewalls of the first opening.

11. The method of claim 8,
    wherein the second etching process further removes the remaining blocking layer.

12. The method of claim 8, wherein the blocking layer comprises self-assembled monolayers (SAM) or polymer brushes.

13. The method of claim 8, wherein the passivation layer comprises an organometallic layer, and the organometallic layer comprises aluminum alkoxide, titanium alkoxide, or a combination thereof.

14. The method of claim 8, wherein the first material layer contains oxide and the second material layer contains nitride.

15. The method of claim 8, wherein after the first etching process, a sidewall of the passivation layer, a sidewall of the remaining blocking layer, and a sidewall of the remaining first material layer are aligned.

16. The method of claim 1, further comprising:
    performing a surface treatment process on the second material layer prior to the formation of passivation layer on the second material layer.

17. The method of claim 16, wherein the surface treatment process comprises a plasma treatment process or a silylation treatment process.

18. The method of claim 1, wherein the passivation layer comprises a polymeric material layer, and the polymeric material layer comprises polyurea, polythiourea, polyurethane, or a combination thereof.

19. A manufacturing method of a semiconductor device, comprising:
    providing a substrate;
    forming a metal-oxide-semiconductor (MOS) transistor over the substrate;
    forming an etch stop layer over the MOS transistor;
    depositing a dielectric layer over the etch stop layer;

forming a first opening in the dielectric layer to expose the etch stop layer;

selectively forming a passivation layer on the dielectric layer to cover a top surface of the dielectric layer and sidewalls of the first opening, wherein a portion of the exposed etch stop layer is uncovered by the passivation layer;

performing a first etching process to remove the portion of the exposed etch stop layer that is uncovered by the passivation layer to form a second opening in the etch stop layer;

performing a second etching process to remove the passivation layer; and filling a conductive material into the first opening and the second opening to form a conductive contact.

20. The method of claim 19, wherein the etch stop layer comprises silicon nitride, and the dielectric layer comprises silicon oxide.

* * * * *